United States Patent [19]

Tyler et al.

[11] Patent Number: 5,774,382

[45] Date of Patent: Jun. 30, 1998

[54] METHOD FOR GENERATING A TABLE MODEL OF A DEVICE

[75] Inventors: Sean C. Tyler; Timothy J. Jennings, both of Chandler, Ariz.

[73] Assignee: Motorola, Inc., Schaumburg, Ill.

[21] Appl. No.: 509,596

[22] Filed: Jul. 31, 1995

[51] Int. Cl.⁶ ..................................................... G06G 7/62
[52] U.S. Cl. .......................... 364/578; 364/488; 364/489
[58] Field of Search .................................. 364/578, 488, 364/489, 490, 491; 371/37.8

[56] References Cited

U.S. PATENT DOCUMENTS

| | | | |
|---|---|---|---|
| 5,031,111 | 7/1991 | Chao et al. | 364/491 |
| 5,047,971 | 9/1991 | Horwitz | 364/578 |
| 5,051,911 | 9/1991 | Kimura et al. | 364/489 |
| 5,282,148 | 1/1994 | Poirot et al. | 364/491 |
| 5,373,457 | 12/1994 | George et al. | 364/578 |
| 5,467,291 | 11/1995 | Fan et al. | 364/490 |

OTHER PUBLICATIONS

Kao, Ansari and Chan. "An Automatic Characterization System for Standard Cells", IEEE 1987 Custom Integrated Circuits Conference, pp. 359–362.

*Primary Examiner*—Kevin J. Teska
*Assistant Examiner*—Tyrone V. Walker
*Attorney, Agent, or Firm*—Rennie William Dover

[57] ABSTRACT

A method (10) for generating a table (26', 26") having independent ($C_L$, $e_r$) and dependent ($P_D$) table model parameters is provided. An initial table (26) is generated by measuring actual values of the dependent table model parameters ($P_D$) for corresponding independent table model parameters ($C_L$, $e_r$) and inserting the actual values into the initial table (26). Calculated table model parameters are generated by calculating values of the dependent table model parameters ($P_D$) corresponding to independent table model parameters ($C_L$, $e_r$), wherein the corresponding independent table model parameters ($C_L$, $e_r$) are between the measured independent table model parameters ($C_L$, $e_r$). The calculated values are compared to measured values and if an error value exceeds a predetermined error tolerance level, the initial table (26) is updated by inserting the actual values of the dependent table model parameters ($P_D$) for corresponding independent table model parameters ($C_L$, $e_r$).

21 Claims, 3 Drawing Sheets

METHOD FOR GENERATING A TABLE MODEL OF A DEVICE

BACKGROUND OF THE INVENTION

The present invention relates, in general, to models, and more particularly, to table based models.

Integrated circuit design often involves large complex circuits having greater than 500,000 transistors. The design of these circuits is greatly simplified by using semi-custom design techniques where the transistors are arranged into building blocks or cells which, in turn, are organized into cell libraries. Each cell or building block models circuit functions such as flipflops, multiplexers, inverters, and the like. Each cell or logic function is organized into a cell library. Selected cells from the cell library are connected together to form integrated circuits.

To reduce manufacturing costs, integrated circuit manufacturers use computer simulation programs to verify the performance and power dissipation of their products. Typically, the integrated circuits are partitioned into cells or building blocks which are characterized using simulation programs such as SPICE (Simulation program with Integrated Circuit Emphasis). More particularly, performance parameters such as output edge rates, set-up and hold times, and propagation delay, as well as power dissipation are characterized using the simulation program. The results of the SPICE simulations for each cell in the cell library are converted into higher level models to allow simulation of integrated circuits without having to revert to SPICE. As those skilled in the art are aware, SPICE performs simulations at the analog transistor level and therefore it is a very time consuming technique for simulating integrated circuits.

One type of higher level model derived from SPICE simulations is a table based model. This type of model is developed by measuring a plurality of values of a dependent variable in response to a plurality of values of one or more independent variables. The plurality of values of the dependent and independent variables are formatted in a tabular form which serves as the table based model. The accuracy of table based models is dependent on the number of entries in the table which in turn is dependent on the maximum allowable size of the table. Thus, the accuracy of table based models is limited by the amount of memory available for storing table values or entries.

Accordingly, it would be advantageous to have a method for generating a model of a device that uses a minimum number of data points yet still provides an acceptable error tolerance.

DETAILED DESCRIPTION OF THE DRAWINGS

Table based models are comprised of one or more tables containing a plurality of values of dependent and independent variables which describe building blocks for an apparatus or device such as an integrated circuit. The present invention provides a method for generating table based models of the apparatus or device. More particularly, the present invention provides a method for refining a table which forms a portion of a model of an integrated circuit building block or cell which is used during the design of the integrated circuit. In the present invention, the table based model is refined in accordance with a comparison between a calculated value and a measured value. When the predetermined error limit is exceeded, the table is expanded by adding the actual values of the dependent and independent variables to the table for which the calculated value of the dependent variable exceeded the error limit.

Figure 1:
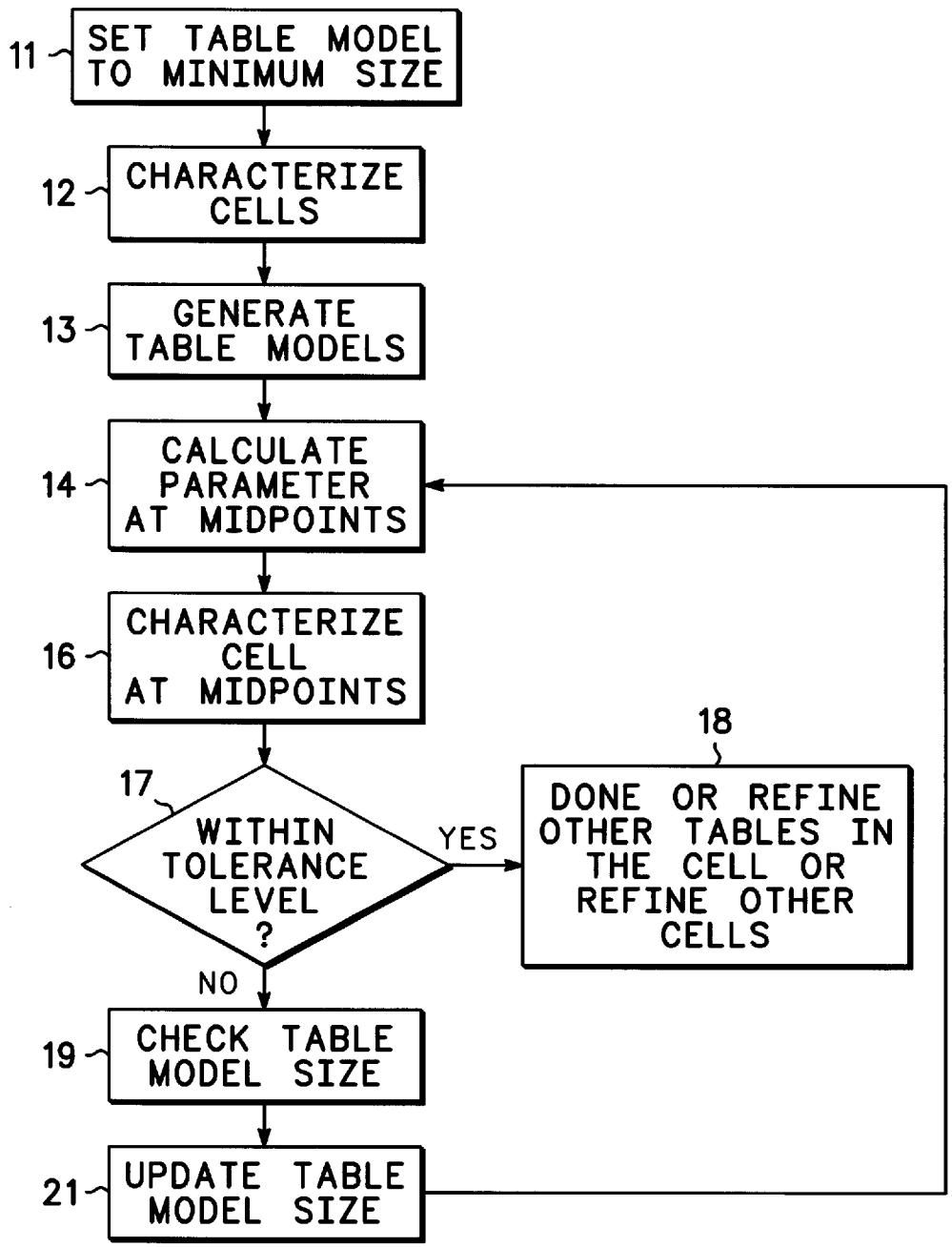
FIG. 1 is a flow diagram of a method for generating a table model of a device in accordance with an embodiment of the present invention.

FIG. 1 is a flow diagram 10 of a method for generating or refining a table model in accordance with an embodiment of the present invention. In a beginning step, indicated by reference numeral 11 of flow diagram 10, the initial size of the table model is set to a minimum value, i.e., a predetermined size. In other words, the table is partitioned such that the number of entries for the independent variables of the table is set to a minimum table entry value and to a maximum table entry value. For example, in a one dimensional table, the number of columns, which represents the number of values of the independent variable, is set to a minimum value. In the one dimensional table, the number of columns represents the number of values of the dependent variable. In a two dimensional table, the number of columns and the number of rows are set to minimum values. In the two dimensional table, the rows of the table represent values of a first independent variable and the columns of the table represent the values of a second independent variable. The numeric entries within the table represent a dependent variable that is dependent on the first and second independent variables. A two dimensional table is further shown and described with respect to FIGS. 2–5. Since the dependent variable is dependent on two independent variables, it is an example of a multi-dependent variable. It should be understood that the number of independent variables from which the dependent variable depends is not a limitation of the present invention. In other words, the table can be of one dimension, two dimensions, three dimensions, or a higher number of dimensions.

The cell is characterized using a simulation program such as, for example, SPICE, to determine the values of the dependent variables for the corresponding values of the independent variables. Characterization of the cells using a simulation program is indicated by reference numeral 12 in flow diagram 10. The initial table model is generated by populating the table with the values of the dependent variables that were determined using the SPICE simulation program. Thus, the values of the dependent variable are inserted into the rows and columns which correspond to the values of the independent variables of the table. Generation of the table is indicated by reference numeral 13 in FIG. 1.

Figure 2:
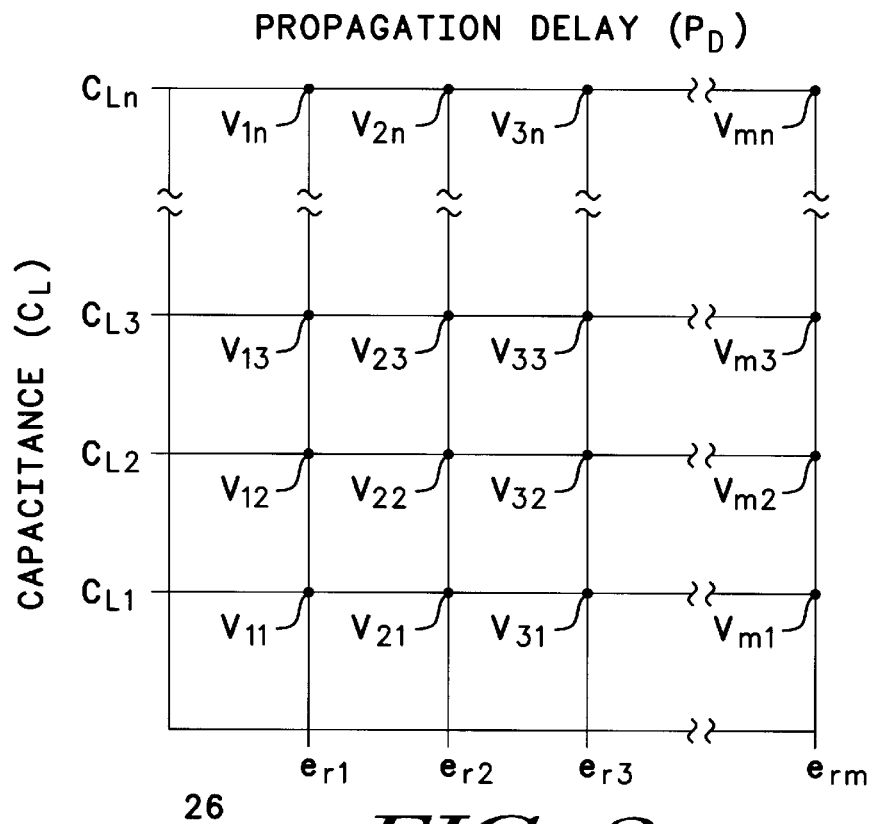
FIG. 2 is a table of a cell in a beginning step of the flow diagram of FIG. 1.

Briefly referring to FIG. 2, a table 26 is shown to further illustrate steps 11–13 of flow diagram 10. By way of example, table 26 is defined by the independent variables of input edge rate, $e_r$, and capacitive loading, $C_L$, and the dependent variable of propagation delay through the cell, $P_D$. The size of table 26 is set such that the values of capacitor, $C_L$, range from a minimum value, $C_{L1}$, to a maximum value, $C_{Ln}$, and the values of the input edge rate, $e_r$, range from a minimum value, $e_{r1}$, to a maximum value, $e_{rm}$. In addition, the number of values for the input edge rate, $e_r$, and capacitive load, $C_L$, is set to be the minimum number. Other suitable dependent variables include other timing variables such as set-up and hold times and rise and fall times as well the amount of energy stored or dissipated.

The values of the dependent variable calculated by the SPICE simulation program in step 13 are inserted into table 26. These values are designated by the subscripted letter V in table 26, wherein the subscript distinguishes the different values of the dependent variable V. Thus, for the independent variables of edge rate and capacitive load having values of $e_{r1}$ and $C_{L1}$, respectively, the value of the dependent variable, i.e., propagation delay, is $V_{11}$, for the independent variables of edge rate and capacitive load having values of $e_{r1}$ and $C_{L2}$, respectively, the value of the dependent variable, i.e., propagation delay, is $V_{12}$, etc. It should be noted that the variables n and m represent real numbers and delineate the particular independent variables used to generate the dependent variable.

Although table 26 is shown as having an unlimited size, it should be understood that in a beginning step of the present invention, i.e., step 11 shown in FIG. 1, the size of each table 26 of the table model is set to a minimum. Since the minimum size of the table model is "user defined," table 26 is shown as having an unlimited size. It should be noted that each value for the dependent variable in table 26 is the result of a SPICE simulation using the corresponding independent variables. Accordingly, the values for the independent variables for which dependent variables have been determined by simulation using a SPICE simulation program are referred to as index values. It should be further noted that table 26 represents a single table for a single cell of a cell library and that there may be many such tables for the cell and many such cells in the cell library. Further, the table model may include a single table, such as table 26, or a plurality of tables.

The data in table 26 is used for calculating delays through logic cells at the cell level rather than at the transistor level as in the case of SPICE simulations. More particularly, the delays through the logic cells are generated using a delay calculator and the table models, which are comprised of tables such as table 26. As those skilled in the art are aware, a delay calculator uses the connectivity of a circuit and values from a table model to generate timing information such as propagation delay, rise and fall times, set-up and hold times, etc. The data-from the timing calculator is then used in other tools such as logic simulators, static timing analysis tools, layout tools, floorplanners, and the like. Referring again to FIG. 1, the cells are simulated in, for example, the logic simulator using values for the independent variables that are between two adjacent index values as shown by step 14 of flow diagram 10. Although the values of the independent variables are shown as being at midpoints between the two adjacent index values, it should be understood that this is not a limitation of the present invention. In other words, the values of the independent variables are merely selected to be between two adjacent index values. Since the values are between adjacent index values, the simulator uses interpolation to calculate the corresponding dependent variables. Methods for performing interpolation are well known to those skilled in the art. The calculated dependent variable is stored for use in calculating an error value.

Figure 3:
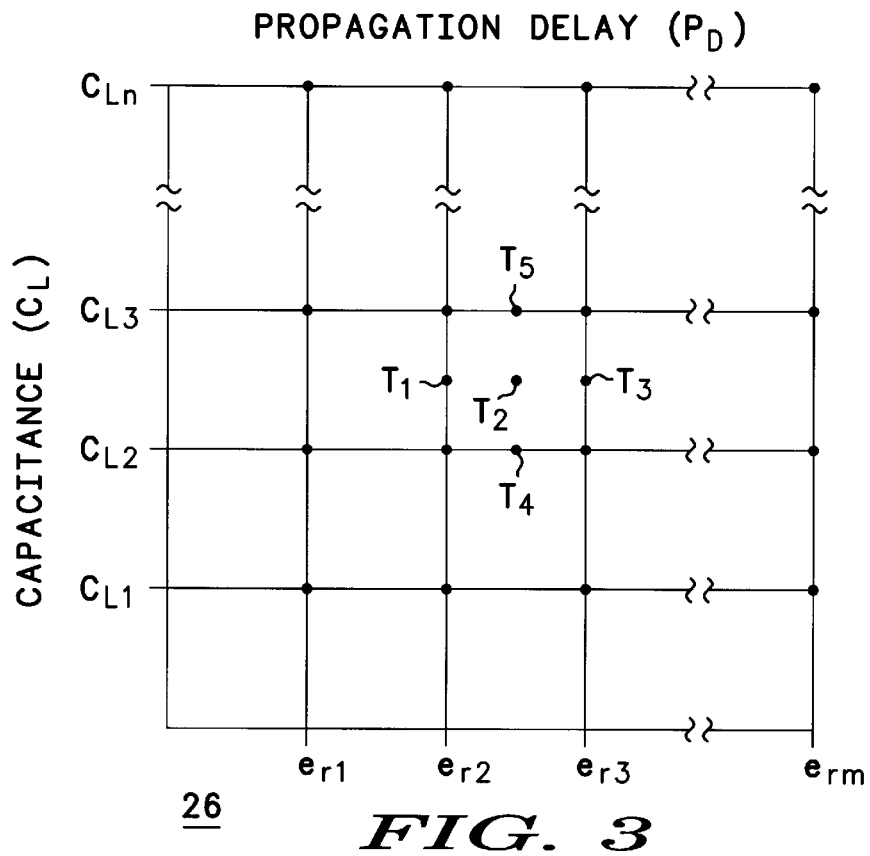
FIG. 3 is a table of a cell during an intermediate step of the flow diagram of FIG. 1.

Briefly referring to FIG. 3, table 26 is illustrated to further describe step 14 shown in FIG. 1. In table 26 shown in FIG. 3, five test points are selected for determining whether the error of values in table 26 falls within an acceptable tolerance level. Thus, the test points serve as selected values of the independent variables. Test points $T_1$ and $T_3$ are selected to have input edge rate values of $e_{r2}$ and $e_{r3}$, respectively, and to have capacitance values that are between the values represented by capacitance index values $CL_L$ and $CL_3$. It should be noted that test points $T_1$ and $T_3$ have input edge rate values that are input edge rate index values. Test points $T_4$ and $T_5$ are selected to have capacitance values $CL_2$ and $CL_3$, respectively, and to have input edge rate values that are between input edge rate index values $e_{r2}$ and $e_{r3}$. It should be noted that test points $T_4$ and $T_5$ have capacitance values that are capacitance index values. Test point $T_2$ is selected to have an input edge rate value that is between input index edge rate values $e_{r2}$ and $e_{r3}$ and a capacitance value that is between capacitance index values $CL_2$ and $CL_3$. In accordance with the present invention, the values of the independent variables er and $C_L$ that are associated with test points $T_1$, $T_2$, $T_3$, $T_4$, and $T_5$ are used to calculate a corresponding set of values for the dependent variable, $P_D$. These values serve as the actual or calculated values for the dependent variable that are used in calculating the error value.

Referring again to FIG. 1, the cells are simulated using the SPICE simulation program and the values of the independent variables $e_r$ and $C_L$ that are associated with test points $T_1$, $T_2$, $T_3$, $T_4$, and $T_5$ are used to calculate a corresponding set of actual values of the dependent variable. This step is illustrated by reference numeral 16 shown in FIG. 1. In other words, the actual values of the propagation delays, $P_D$, are measured for the corresponding values of input edge rate, $e_r$, and capacitive loading, $C_L$, at the test points $T_1$, $T_2$, $T_3$, $T_4$, and $T_5$ using the SPICE simulation program. Although steps 14 and 16 are shown as being performed sequentially, it should be understood these steps may be performed in parallel. It should be noted that test points such as $T_1$–$T_5$ are placed between adjacent independent index values to expand the tables where needed.

Error values are determined for each test point $T_1$, $T_2$, $T_3$, $T_4$, and $T_5$. One technique for determining the error values is to calculate the percentage deviation of the calculated values from the corresponding measured or actual values for each dependent variable. The error values are compared to a predetermined acceptance value to determine whether each error value falls within an acceptable tolerance level, i.e., to determine the status of an error acceptance condition. This step is indicated by decision diamond 17 of FIG. 1. If the error values fall within an acceptable tolerance level, the table for the particular cell is complete, i.e., table refinement has been finished. Other suitable techniques for determining error values are known to those skilled in the art. It should be noted that the process may be complete after the generation or refinement of a single table or the process can be repeated on other tables in the cell or other tables in a different cell, i.e., other cells of the cell library, as indicated by step 18 of FIG. 1. In other words, the refinement of one table in the cell may be complete and other tables within the cell still need to be refined, or refinement of all the tables and the cell may be complete and other cells still need to be refined, or all tables and cells may have been refined.

If one or more of the error values do not fall within an acceptable tolerance level, table 26 is expanded or refined by adding the values of the independent variables for the test points $T_1$, $T_2$, $T_3$, $T_4$, or $T_5$ having error values that were not within the acceptable tolerance level to table 26. This step is indicated by reference numeral 21 of FIG. 1. In other words, the table is expanded to include the values of the independent variables that correspond to test points $T_1$, $T_2$, $T_3$, $T_4$, or $T_5$ for which the error value was not within the acceptable tolerance level. It should be noted there may be an upper limit on the size of the table. Thus, prior to updating the table, its size may be compared with the maximum table size to determine whether it can be expanded as indicated by step 19 of FIG. 1. It should be noted that when the step of determining whether the table can be expanded is a matter of design choice. For example, it may be desirable to determine whether the table can be expanded before calculating parameters such as values of dependent variables at a midpoint value of an independent variable, i.e., before performing step 14.

Figure 4:
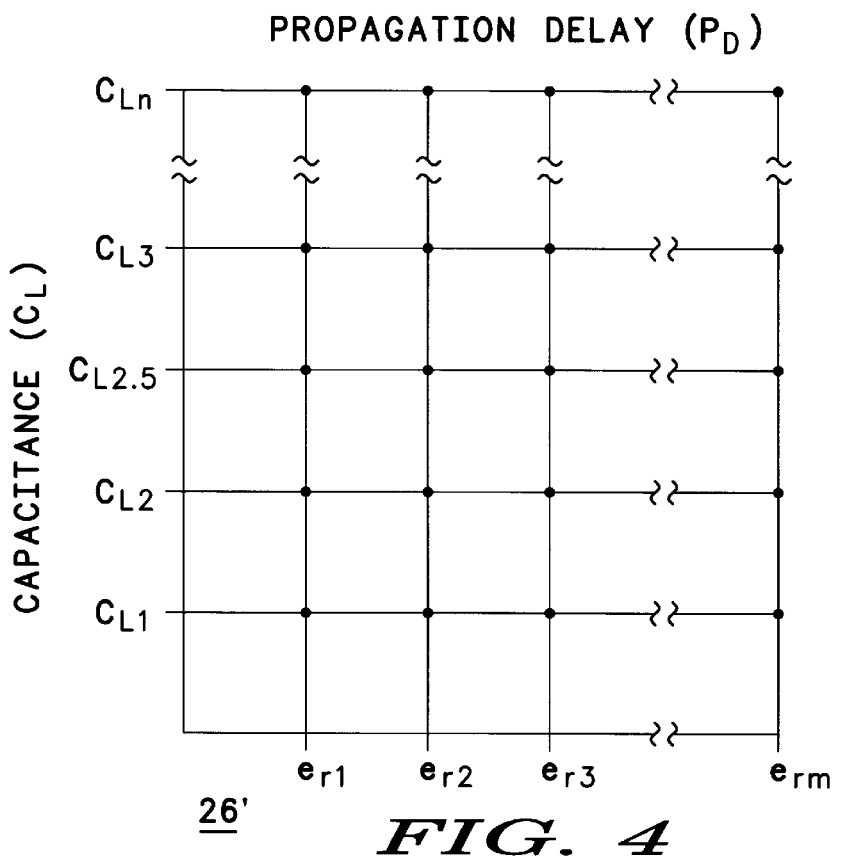
FIG. 4 is a table expanded in a single direction in accordance with the embodiment of the present invention.
Figure 5:
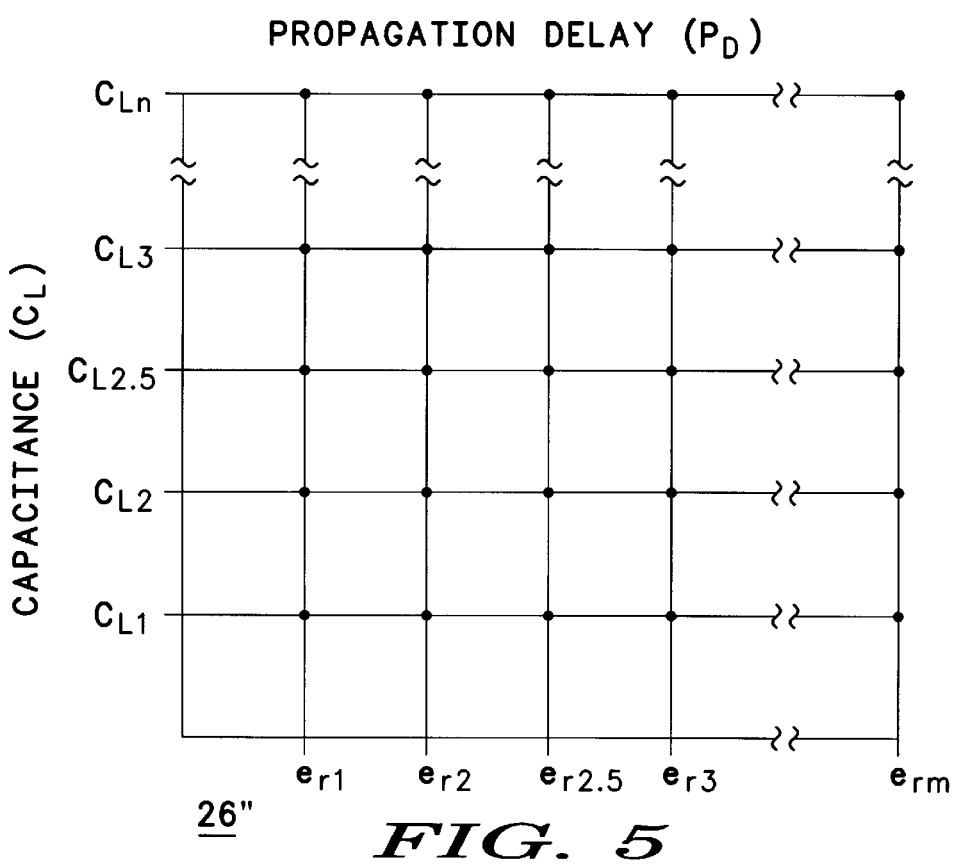
FIG. 5 is a table expanded in two directions in accordance with the embodiment of the present invention.

Briefly referring to FIGS. 4 and 5, tables 26' and 26" are illustrated to further describe step 21 shown in FIG. 1. Table 26' is an expanded or modified version of table 26, thus a prime (') has been attached to reference numeral 26. Test points which are on one axis and between two adjacent axes and for which the error exceeds an acceptable tolerance level are expanded to include an index value between the two adjacent axes. In other words, the table is-expanded in a single direction. For example, assume the error value of the propagation delay, $P_D$, for test point $T_1$ of table 26 exceeds the error tolerance level. Since the propagation delay, $P_D$, of test point $T_1$ is exceeded and test point $T_1$ is on an index axis, i.e., $e_{r2}$, then the error that occurs is due to the values of capacitance index axis, $C_L$. Accordingly, table 26 is expanded along the capacitance index axis to include the capacitance load, $C_L$, input edge rate, $e_r$, and propagation delay, $P_D$, associated with test point $T_1$, thereby forming table 26'. Expansion of table 26 to form table 26' is shown by the addition of an entry, $C_{L2.5}$, on the capacitance index axis.

FIG. 5 illustrates an example of expanding table 26 in two directions. Table 26" is an expanded version of table 26, thus two primes (") have been attached to reference numeral 26. Expansion of the table in two directions occurs when the error value of the propagation delay, $P_D$, for a test point exceeds the acceptable tolerance level and the test point is between two sets of index axes. For example, assume the propagation delay for test point $T_2$ of FIG. 3 exceeds the acceptable tolerance level. It should be noted that test point $T_2$ is between the index axes represented by input edge rate index values $e_{r2}$ and $e_{r3}$ and the index axes represented by capacitance index values $CL_2$ and $CL_3$. Thus, both the capacitive load and the input edge rate contribute to the error associated with test point $T_2$. Accordingly, table 26 is expanded along the capacitance index axis and the input edge rate axis to include the capacitance loads, $C_L$, input edge rates, $e_r$, and propagation delays, $P_D$, associated with test point $T_2$, thereby forming table 26". Expansion of table 26 to form table 26' is shown by the addition of an entry, $C_{L2.5}$, in the capacitance index axis and an entry, $e_{r2.5}$, in the input edge rate index axis.

Referring again to FIG. 1, the expanded table model steps 14, 16, 17, 19, and 21 are repeated on the expanded table model, i.e., tables 26' or 26', to further refine the table model. It should be understood that further refinement of the expanded table model is an optional step. Once the desired level of refinement is achieved the method is complete.

By now it should be appreciated that a method for refining or generating a table model has been provided. The method is easily implemented using a computer and permits use of tables or table models of a size that provides a desired level of accuracy. If the accuracy of the table model is insufficient, it is expanded by the addition of dependent and independent variables. An advantage of table models developed in accordance with the present invention is that their sizes are set based on the desired accuracy, thereby assuring minimal table model sizes which, in turn, assures that a minimal amount of memory is used. In addition, the present invention improves the accuracy of table models as well as reduces the cell model generation time. The present invention is applicable to table models used in fields such as engineering, medicine, economics, etc. Further, since the method allows for selection of the desired error tolerance, it is a programmable method.

We claim:

1. A computer implemented method for generating a table model of a device that is used for manufacturing the device, comprising the steps of:

(a) measuring first and second values of an independent variable and respective first and second values of a dependent variable, wherein the independent variable is independent of a physical process and the dependent variable is dependent on the physical process during design of the device;

(b) storing the first and second values of the independent variable and the respective first and second values of the dependent variable in an initial table, wherein the first and second values of the independent variable and the respective first and second values of the dependent variable are used in the initial table as minimum and maximum values of the initial table, respectively;

(c) determining a calculated value of the dependent variable for a selected value of the independent variable, wherein the selected value of the independent variable is between the first and second values of the independent variable;

(d) determining an actual value of the dependent variable for the selected value of the independent variable;

(e) determining an error value between the calculated value of the dependent variable for the selected value of the independent variable and the actual value of the dependent variable for the selected value of the independent variable;

(f) comparing the error value with an acceptance value;

(g) modifying one of the initial table or a modified table in accordance with a result of comparing the error value with an acceptance value by repeating steps (c) through (g) to generate the table model;

(h) generating a device design using the table based model; and (i) manufacturing the device in accordance with the device design.

2. The computer implemented method of claim 1, further including using a computer to generate the table model.

3. The computer implemented method of claim 1, further including generating the table model for a building block of an integrated circuit.

4. The computer implemented method of claim 1, wherein the step of determining an actual value of the dependent variable for the selected value of the independent variable includes using a simulator.

5. The computer implemented method of claim 1, wherein the step of determining an error value between the calculated value of the dependent variable for the selected value of the independent variable and the actual value of the dependent variable for the selected value of the independent variable includes using a percentage deviation to determine the error value.

6. The computer implemented method of claim 1, wherein the step of measuring first and second values of an independent variable and respective first and second values of a dependent variable includes simulating the physical process.

7. A computer implemented method for generating a table model of a device that is used for manufacturing the device, comprising the steps of:

(a) measuring first and second values of an independent variable and respective first and second values of a dependent variable, wherein the independent variable is independent of a physical process and the dependent variable is dependent on the physical process during design of the device;

(b) storing the first and second values of the independent variable and the respective first and second values of the dependent variable in an initial table;

(c) determining a calculated value of the dependent variable for a selected value of the independent variable, wherein the selected value of the independent variable is between the first and second values of the independent variable;

(d) determining an actual value of the dependent variable for the selected value of the independent variable;

(e) determining an error value between the calculated value of the dependent variable for the selected value of the independent variable and the actual value of the dependent variable for the selected value of the independent variable;

(f) comparing the error value with an acceptance value;

(g) modifying one of the initial table or a modified table in accordance with a result of comparing the error value with an acceptance value by repeating steps (c) through (g) to generate the table model, wherein modifying the initial table includes inserting the selected value of the independent variable and the actual value of the dependent variable for the selected value of the independent variable into the initial table;

(h) generating a device design using the table based model; and (i) manufacturing the device in accordance with the device design.

8. The computer implemented method of claim 7, further including generating the table model for a building block of an integrated circuit.

9. The computer implemented method of claim 7, wherein the step of determining an actual value of the dependent variable for the selected value of the independent variable includes using a simulator.

10. The computer implemented method of claim 7, wherein the step of determining an error value between the calculated value of the dependent variable for the selected value of the independent variable and the actual value of the dependent variable for the selected value of the independent variable includes using a percentage deviation to determine the error value.

11. A computer implemented method for generating a table model of a device that is used for manufacturing the device, comprising the steps of:

(a) measuring first and second values of an independent variable and respective first and second values of a dependent variable, wherein the independent variable is independent of a physical process and the dependent variable is dependent on the physical process during design of the device;

(b) storing the first and second values of the independent variable and the respective first and second values of the dependent variable in an initial table;

(c) determining a calculated value of the dependent variable for a selected value of the independent variable, wherein the selected value of the independent variable is between the first and second values of the independent variable;

(d) determining an actual value of the dependent variable for the selected value of the independent variable;

(e) determining an error value between the calculated value of the dependent variable for the selected value of the independent variable and the actual value of the dependent variable for the selected value of the independent variable;

(f) comparing the error value with an acceptance value;

(g) comparing a size of one of the initial table or a modified table with a predetermined table size;

(h) if the size of the initial table is less than the predetermined table size, modifying the one of the initial table or the modified table in accordance with a result of comparing the error value with an acceptance value by repeating steps (c) through (h) to generate the table model; and (i) generating a device design using the table based model; and (j) manufacturing the device in accordance with the device design.

12. A computer implemented method for generating a table based model of an integrated circuit that is used for manufacturing the integrated circuit, comprising the steps of:

(a) defining first and second values of an independent variable that are independent of a physical process during design of the integrated circuit, wherein the first and second values of the independent variable serve as table entries for the table based model, and further including defining the first value as a minimum table entry value for the table based model and defining the second value as a maximum table entry value for the table based model;

(b) measuring a dependent variable that is dependent on a physical process during the design of the integrated circuit and corresponds to the independent variable to determine a plurality of values of the dependent variable for corresponding values of the independent variable;

(c) generating a table based model using the plurality of values of the dependent variable and the corresponding values of the independent variable;

(d) determining a calculated value of the dependent variable for a value of the independent variable that is greater than the first value and less than the second value of the independent variable;

(e) measuring an actual value of the dependent variable for the value of the independent variable that is greater than the first value and less than the second value of the independent variable;

(f) determining an error value between the calculated value and the actual value;

(g) comparing the error value with a predetermined acceptance value to determine a status of an acceptance condition;

(h) modifying the table entries in accordance with the error condition by repeating steps (d) through (h) to form a modified table which serves as a table model; model; and (i) generating an integrated circuit design using the table based model; and (j) manufacturing the integrated circuit in accordance with the integrated circuit design.

13. The computer implemented method of claim 12, wherein step (d) includes using an interpolation method to determine the value of the dependent variable for the value of the independent variable that is greater than the first first value and less than the second value of the independent variable.

14. The computer implemented method of claim 13, further including using one of linear or bilinear inpterpolation method.

15. The computer implemented method of claim 12, wherein step (e) includes using a simulation program to measure the actual value.

16. The computer implemented method of claim 11, wherein step (f) includes calculating a percentage deviation to generate the error value.

17. A computer implemented method for refining a table which forms a portion of a model during design of an integrated circuit, comprising the steps of:

(a) setting the table to a predetermined size, wherein the predetermined size includes entering first and second values in the table for an independent variable;

(b) measuring a dependent variable that is dependent on a physical process during the design of the integrated circuit and corresponds to an independent variable to determine a plurality of measured values of the dependent variable for corresponding values of the independent variable;

(c) generating a calculated value of the dependent variable for a value of the independent variable between the first and second values in the table for the independent variable;

(d) generating a new measured value of the dependent variable for a value of the independent variable between the first and second values in the table for the independent variable;

(e) comparing the calculated value to the new measured value to generate an error signal;

(f) comparing the error signal with an acceptance value to determine a status of an acceptance condition;

(g) modifying the table in accordance with the status of the error condition by inserting the value of the independent variable between the first and second values in the table for the independent variable and repeating steps (c) through (g) to form a modified table which serves as a table model;

(h) generating an integrated circuit design using the table based model; and (i) manufacturing the integrated circuit in accordance with the integrated circuit design.

18. The computer implemented method of claim 17, wherein step (c) includes using an interpolation method to calculate the calculated value of the dependent variable.

19. The computer implemented method of claim 17, wherein step (d) including using a simulation program to generate the new measured value.

20. The computer implemented method of claim 17, wherein step (b) includes using one of timing or energy as the dependent variable.

21. A method for generating a table based model of an integrated circuit, comprising the steps of:

(a) defining first and second values of an independent variable that are independent of a physical process during design of the integrated circuit, wherein the first and second values of the independent variable serve as table entries for the table based model;

(b) measuring a dependent variable that is dependent on a physical process during the design of the integrated circuit and corresponds to the independent variable to determine a plurality of values of the dependent variable for corresponding values of the independent variable;

(c) generating a table based model using the plurality of values of the dependent variable and the corresponding values of the independent variable;

(d) determining a calculated value of the dependent variable for a value of the independent variable that is greater than the first value and less than the second value of the independent variable;

(e) measuring an actual value of the dependent variable for the value of the independent variable that is greater than the first value and less than the second value of the independent variable;

(f) determining an error value between the calculated value and the actual value;

(g) comparing the error value with a predetermined acceptance value to determine a status of an acceptance condition;

(h) modifying the table entries in accordance with the error condition by inserting the value of the independent variable greater than the first value and less than the second value of the independent variable into the table model as a table entry and repeating steps (d) through (h) to form a modified table which serves as a table model;

(i) generating an integrated circuit design using the table based model; and (j) manufacturing the integrated circuit in accordance with the integrated circuit design.

* * * * *

UNITED STATES PATENT AND TRADEMARK OFFICE
CERTIFICATE OF CORRECTION

PATENT NO. : 5,774,382
DATED : 30 June, 1998
INVENTOR(S) : Sean C. Tyler et al.

It is certified that error appears in the above-identified patent and that said Letters Patent is hereby corrected as shown below:

In claim 12, column 8, line 59, delete "model".

In claim 13, column 9, line 2, delete the last word (duplicate) "first".

In claim 16, column 9, line 11, delete "11" and replace with --12--.

Signed and Sealed this

Twenty-sixth Day of October, 1999

Attest:

Q. TODD DICKINSON

*Attesting Officer*  Acting Commissioner of Patents and Trademarks